United States Patent [19]
Hemming

[11] 4,218,683
[45] Aug. 19, 1980

[54] RANGE FOCUS LENS

[75] Inventor: Leland H. Hemming, Poway, Calif.

[73] Assignee: Plessey, Incorporated, New York, N.Y.

[21] Appl. No.: 936,906

[22] Filed: Aug. 25, 1978

Related U.S. Application Data

[63] Continuation-in-part of Ser. No. 783,719, Apr. 1, 1977, abandoned.

[51] Int. Cl.$^2$ ............................................. H01Q 1/28
[52] U.S. Cl. ........................... 343/703; 343/18 A; 343/911 R
[58] Field of Search ............... 343/703, 909, 783, 784, 343/785, 753, 18 R, 18 A, 911 R, 911 L

[56] References Cited

U.S. PATENT DOCUMENTS

| | | | |
|---|---|---|---|
| 2,511,610 | 6/1950 | Wheeler | 343/910 |
| 2,577,619 | 12/1951 | Kock | 343/783 |
| 2,596,251 | 5/1952 | Kock | 343/909 |
| 2,887,684 | 5/1959 | Dexter et al. | 343/909 |
| 3,101,472 | 8/1963 | Goubau | 343/909 |
| 3,290,598 | 12/1966 | Thomas | 343/18 A |
| 3,302,205 | 1/1967 | Johnson | 343/781 |

OTHER PUBLICATIONS

Kouyoumjian et al., "Range Requirements in Radar Cross Section Measurements," Proceedings of the IEEE 5/65, pp. 920–928.
Mentzer, J. R., "The Use of Dielectric Lenses in Reflection Measurements," Proceedings of the IRE, 9/52, pp. 252–256.

*Primary Examiner*—David K. Moore
*Attorney, Agent, or Firm*—James J. Burke, II

[57] ABSTRACT

Various aspects of electro-magnetic testing are facilitated by inserting a foamed plastic dielectric lens at a particular position between a particular radiating source and the test aperture. The lens is constructed according to electro-optic formulae and the radiation wavelength to produce a plane wave of uniform phase. To control extraneous energy contributed by reflections from the flat face of the lens, this surface is provided with two layers of high-performance absorber material. The amplitude characteristics in the test region are controlled by appropriate selection of the source antenna. Radiation-absorbent material is also provided to eliminate amplitude distortion. This makes possible testing under far-field conditions in test cells of modest size, which has heretofore been possible only with elaborate parabolic reflectors. Weather restrictions on use of free-space ranges, the sheer size of such ranges, and security problems attendant on their use, are all thus avoided. The lens can be manufactured from any plastic having a suitable dielectric constant, by either blowing the plastic in a suitable mold, or by machining from a preformed foam block. The absorber layers are loaded with conductive carbon to provide desired insertion loss and attached to the flat face.

26 Claims, 13 Drawing Figures

RANGE FOCUS LENS

RELATED APPLICATIONS

This application is a continuation-in-part of U.S. application Ser. No. 783,719 filed Apr. 1, 1977, now abandoned.

BACKGROUND OF THE INVENTION

The present invention relates in general to electromagnetic test systems. More particularly, the present invention relates to antenna test range design. Still more particularly, the present invention relates to the creation of so called farfield test conditions in a very limited space, as for example in anechoic chambers.

The principles of antenna range design are discussed in detail by Hollis et al, "Microwave Antenna Measurements" (Scientific-Atlanta, Inc., 1969), but the following summary of portions thereof will assist in understanding the invention. When testing any radiating devices or device/systems receiving electromagnetic energy, the ideal test environment for determining farfield performance is to provide a plane wave of uniform amplitude and phase to illuminate the test aperture. Various approaches to simulation of this ideal electromagnetic environment have led to the evolution of two basic types of electromagnetic test facilities:

(1) Free-space Ranges
(2) Reflection Ranges

Free-space ranges are those in which an attempt is made to suppress or remove the effects of all surroundings, including the range surface or surfaces, on the wavefront which illuminates the test antenna. This suppression is sought through one or more of such factors as (a) directivity and sidelobe suppression of the source antenna and test antenna, (b) clearance of the line of sight from the range surface, (c) redirection or absorption of energy reaching the range surface, and (d) special signal processing techniques such as tagging by modulation of the desired signal or by use of short pulses.

The typical geometries associated with the free-space approach include the elevated range, the slant range, the rectangular anechoic chamber, and, above certain limiting frequencies, the tapered anechoic chamber. A recent development in this area is the compact range, in which the test antenna is illuminated by collimated energy in the aperture of a larger point—or line—focus antenna.

Reflection ranges are designed to make use of energy which is reradiated from the range surface(s) to create constructive interference with the direct-path signal in the region about the test aperture. The geometry is controlled so that a small, essentially symmetric amplitude taper is produced in the illuminating field. The two major types of reflection ranges in use are the ground reflection range and, for low frequencies, the tapered anechoic chamber.

For either basic type of range, the fundamental electromagnetic design criteria deal with control of five factors: (A) Inductive or radiation coupling between antennas; (B) Phase curvature of the illuminating wavefront; (C) Amplitude taper of the illuminating wavefront; (D) Spatially periodic variations in the illuminating wavefront caused by reflections; and (E) Interference from spurious radiating sources.

Items A through D primarily establish the dimensional requirements in the range design, and limiting values of source-antenna directivity. Item E must be considered in the overall design.

At lower microwave frequencies, effects of inductive coupling between the source antenna and the test antenna must be considered. Such effects are usually considered negligible when the criterion $$R \leq 10\lambda \qquad (1)$$

is satisfied, where R is the separation between antennas and $\lambda$ is the wavelength. The criterion is based on the field equations for an elemental electric dipole, from which the ratio of the amplitude of the induction field to that of the radiation field is seen to be $$\rho\epsilon = (\lambda/2\pi R) \qquad (2)$$

At $R \geq 10\lambda$, $\rho\epsilon \geq 1/20\pi$, and the criterion is seen to be equivalent to the requirement that $$20 \log (\rho\epsilon) \geq -36 \text{ decibels} \qquad (3)$$

The effect of curvature of the incident phase front is a most important one. The principal difficulty is that the generally accepted criteria is that the minimum range length acceptable is determined by the relationship $$R \geq (2D^2/\lambda) \qquad (4)$$

Where D is the diameter or maximum dimension of the test item (e.g. aperture).

For apertures in excess of twelve (12) inches at X-Band or above (>8 GHz) the range length requirement is longer than sixteen (16) feet, which is the maximum length of the most common size rectangular chambers used for measuring low gain antennas. Due to the high cost of absorbing materials, larger chambers are prohibitively expensive, and outdoor ranges are not always conveniently available, either due to lack of space or weather.

More particularly, in the absence of reflections, the phase variation of the field over the aperture of a receiving antenna of a given size and operating at a given frequency depends almost entirely on the separation between the source antenna and the receiving antenna. If the receiving antenna is in the far zone of the transmitting antenna, the phase front of the approaching wave deviates very little from a section of a sphere centered on the transmitting antenna over the major portion of the main lobe.

It can be shown that over a planar receiving aperture the variation of the phase of the incident field is caused almost entirely by deviation of the test aperture from the sphere on the transmitting antenna if the receiving antenna subtends less than a half-power beamwidth of the transmitting antenna's wave front. In practice, the antenna under test will subtend considerably less than a half-power beamwidth in order to reduce error from mutual coupling and from amplitude taper of the incident field over the test aperture.

Figure 1:
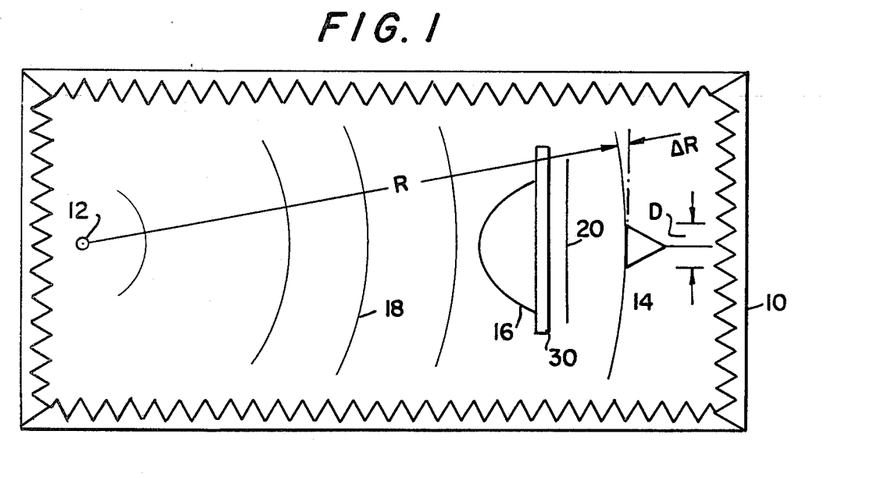
FIG. 1 is a simplified schematic drawing of an anechoic test chamber including an embodiment of the invention.

An expression for the phase deviation over a planar test aperture can be determined from FIG. 1. Since $$R^2 + (D^2/4) = (R + \Delta R)^2 \qquad (5)$$

$$\Delta R \doteq (D^2/8R) \qquad (6)$$

if $R^2$ is neglected. The corresponding phase deviation is given by $$\Delta\phi = (2\pi\Delta R/\lambda) = (\pi D/4\lambda R) \text{ radians} \quad (7)$$

A commonly employed criterion for determining the minimum allowable separation between the source antenna and the antenna under test is to restrict $\Delta\phi$ to a maximum of $\pi/8$ radian, or 22.5 degrees. Under this condition, $R \geq 2D^2/\lambda$ (Eq.4), there will be a significant departure of the nulls of the radiation pattern and the location and levels of the minor lobes from their infinite-range values. The amount of the deviation depends on the original side-lobe level and structure. Calculations have shown that for a range of $2D^2/\lambda$, the first null of the pattern produced by a rectangular aperture with uniform illumination has relative level of about $-23$ decibels instead of $-\infty$ decibels. This theoretical deviation is due solely to phase-error effects; the incident-wave amplitude over the test aperture was assumed constant. The infinite range pattern in the above case has a (sin x/x) configuration, with a relative first-lobe level of about $-13$ decibels.

The effect of amplitude taper over the test aperture must also be considered. For accuracy in simulated far zone measurements, the illuminating field must be sufficiently constant in amplitude both along the line-of-sight and in planes normal to the line-of-sight.

Consider an antenna under test on receiving, which has a maximum dimension, L, of its active region along the line-of-sight. If the separation between the source of antenna and the center of the active region is $R_o$, then the ratio $p\rho$ of the power density at the forward extreme of the active region to that at the rear is given by $$10 \log (p) = 20 \log \frac{(R_o + L/2)}{(R_o - L/2)} \text{ decibels} \quad (8)$$

Severe axial variations of the illuminating field can cause measurement error, particularly in the minor lobe structure of radiation patterns. For most antenna types which have significant depth to their active regions, such error is usually negligible when the power density over the region is constant to within one decibel. This condition corresponds to an approximate restraint $$R_o \geq 10L \quad (9)$$

The criterion for such structures as high-gain disc-on-rod antennas, often is more restrictive than the greater of the previously discussed range-length criteria which were based on suppression of inductive coupling and phase curvature.

The effect of amplitude taper of the incident field over a plane normal to the line of sight and adjacent to the test aperture can be considered from the viewpoint of reciprocity. Variation of the amplitude of the field over the aperture on receiving is analogous—within the accuracy of the aperture field approach—to modification of the aperture illumination by the primary feed on transmitting. For example, the pattern of an antenna whose feed would produce an aperture illumination $f(\theta,r)$ on transmitting, where $(\theta,r)$ indicates position in the aperture, if illuminated on receiving by a source antenna which produces over the test aperture an amplitude taper $g(\theta,r)$, the measured pattern would be analogous to that of a transmitting antenna illuminated by a feed which produces an illumination of $f(\theta,r)g(\theta,r)$ over the aperture. If $g(\theta,r)$ is constant in amplitude and phase over the aperture, the measured pattern will be the same as the infinite-range pattern for the illuminations $f(\theta,r)$.

The greater $g(\theta,r)$ deviates from constant, the greater will be the deviation of the measured pattern from the infinite-range pattern. The quantitative effect of nearly constant functions $g(\theta,r)$ cannot be determined, however, without assumption of $f(\theta,r)$.

Calculations indicate that for a 0.5 dB amplitude taper across the unit under test a 0.15 dB decrease in measured gain will result. If the taper is equal to 0.25 dB, the error is less than 0.1 dB.

If a source antenna is employed which is calculated to produce a taper of the field over the test aperture, it is essential that the transmitting antenna be directed such that the peak of its beam is centered on the antenna under test to prevent excessive and asymmetrical illumination taper with a resultant increase in the measuring error. It is important to note that error from symmetrical amplitude taper within the accepted criterion of 0.25 decibel does not produce a defocusing type of error, but rather a small modification of the measured side-lobe levels and an error in measured gain.

As discussed above, the testing of microwave antennas usually requires that the device under test be illuminated by a uniform plane electromagnetic wave. However, the creation of such a wave can be a difficult task. Conventional techniques require that a transmitting antenna be located at a sufficient distance from the test antenna such that its spherical wavefront closely approximates a uniform plane wave incident upon the test device.

Since ranges of several hundred to several thousand feet are often required to satisfy the $dD^2/\lambda$ criteria, far-zone measurements usually are taken on outdoor installations which are subject to adverse weather conditions and changing range effects. Further, the cost of land for such ranges (adjacent or at lease near the manufacturing facility) can be very high, and security can be a problem. Small antenna or targets may be tested adequately in anechoic chambers, but since large antennas (large in terms of wavelength) require long ranges, the cost of a chamber for such tests becomes prohibitively high.

The technique described in U.S. Pat. No. 3,302,205 enables measurements with full-size antennas or fair size targets to be made on indoor 'compact ranges', and is currently available. A range reflector and a special feed system close to the test device are used to produce incident plane waves and far-zone results are obtained. A properly focused parabolic-type reflector collimates the rays and thus produces a plane wave across its aperture. This wave is not uniform due to the illumination taper of the feed horn, and due to space-attenuation effects. However, a properly selected feed will generate a wave which is approximately uniform over an acceptable area. It is this area of an approximately uniform plane wave that is used on compact ranges to illuminate the antenna under test. This patent also speaks of prior efforts to produce plane wave illumination with lenses, noting that unsatisfactory results were obtained due to amplitude distortion caused by random and uncontrolled reflections.

Dielectric lenses and cones are known per se, and have been used in microwave and other transmission systems for many years. The principles of design of a dielectric lens were described by Silver, "Microwave Antenna Theory and Design (McGraw Hill, 1949)." The use of conical dielectric horns to improve the efficiency of microwave reflector and horn antennas is disclosed in U.S. Pat. No. 3,430,244, No. 3,414,903 and No. 6,611,391 of Bartlett et al. In the U.S. Pat. No. 3,414,903 patent, a cone of low dielectric constant material is used in conjunction with a lens of higher dielectric constant material to produce a transmitter with a substantial side-lobe depression and a planar wave front.

Understanding of the invention will be facilitated by considering the following analysis of two simple lens types: the planoconvex lens and the meniscus lens. The profiles of these lenses are known and may be found in Silver (*op. cit.*)

Figure 2:
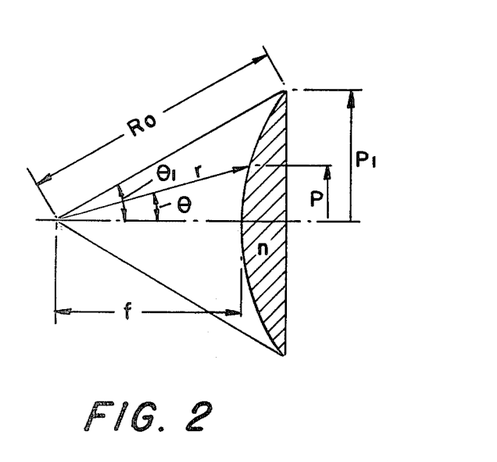
FIG. 2 and FIG. 3 are cross sectional elevations of planoconvex lens and a meniscus lens, respectively, with various lens parameters noted thereon.

For a planoconvex lens (from FIG. 2):

$$f = r \frac{(1 - n \cos \theta)}{1 - n} \quad (10)$$

where $n = \sqrt{\epsilon/\epsilon_0}$ = relative permittivity of the lens, also defined as the refractive index or dielectric constant, and $f$ = focal length of the lens.

Figure 3:
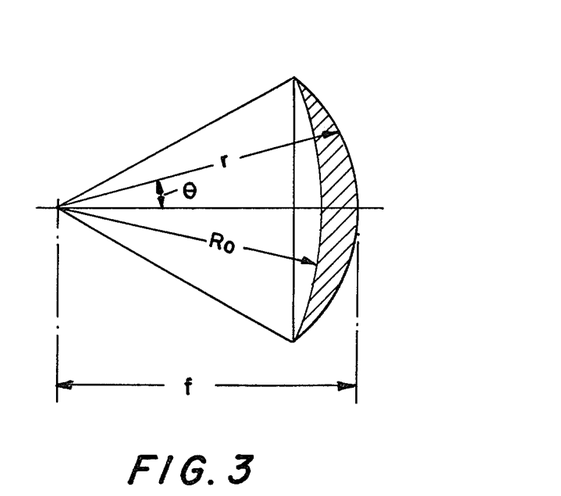

For a meniscus lens (see FIG. 3):

$$f = \frac{(n - \cos \theta)}{n - 1} \quad (11)$$

The focal length of the lens is the distance from the phase center of the illuminating antenna to the center of the closest point on the planoconvex lens and the center of the lens farthest from the phase center of the meniscus lens.

To generate the lens geometry given the focal length and the relative permittivity, the equations are rearranged as follows:

Planoconvex Lens:

$$r = \frac{f(1 - n)}{(1 - n \cos \theta)} \quad (12)$$

Meniscus Lens:

$$r = \frac{f(n - 1)}{(n - \cos \theta)} \quad (13)$$

To be useful, the lens of the invention must not degrade the performance of the test region consistent with the following guide lines:

The lens operates only on the propagation constant in the wave equation. That is, the wavefront is delayed more at the center of the lens than at the edges. Thus, a spherical wavefront striking the lens delays the center of the wavefront greater in the center, thus causing the emerging wavefront to be all in line or uniform as it is called in the antenna testing field. This approximate uniform field is then used to illuminate a test device which is typically an antenna. The result is that the test antenna "sees" far field test conditions (uniform amplitude and phase) and thus behaves as if it were one. Thus, by inserting a lens between a source antenna and a test antenna the distance can be shortened because the lens provides the delay needed to cause a planar wavefront to be created.

When the wave passes through the lens it encounters the boundaries between the lens and free space. Due to the difference in the dielectric constant of air and the lens, a portion of the wave is reflected at each boundary. These do not occur uniformly, since the lens geometry varies in thickness; thus the uniformity of the wave actually reaching the test region is distorted by the reflections and refractions at the lens boundaries. This distortion appears as ripples on the amplitude properties of the wave in the test region. If the dielectric constant is low enough, however, then this ripple is well within acceptable values.

Unfortunately, solid dielectrics traditionally used in such applications (ethyl cellulose, polyethylene, polystyrene, polyisobutylene or methyl methacrylate) all have a dielectric constant that is much too high to be of use. It is believed that efforts of prior workers to create plane wave conditions with lenses could have been unsatisfactory because of a failure to recognize (1) the need to use a lens of very low dielectric constant and (2) the need to independently minimize amplitude distortion (e.g., reflections) by using absorbent materials and proper selection of the source antenna in the test range.

In addition to boundary reflections referred to supra, the test antenna will reflect a certain amount of energy back to the lens, which re-reflects it back to the antenna, as an extraneous signal of arbitrary phase. This can cause serious measurement problems. More particularly, no antenna or other radiating device is 100% efficient; most will capture 50-70% of the incident energy, and some are only 25% efficient. The energy not captured is scattered from the surface of the structure, with much of it travelling back toward the transmitting antenna. Indeed, when carrying out radar cross-section measurements, all of the energy is reflected, since the target acts as short-circuited antenna. In a conventional free space test range, the reflected energy is attenuated in space and does not get back to the test device. With a lens test system, in accordance with the present invention, a reflection will occur. More particularly, the higher the dielectric constant of the lens, the more compact the test range may be, but the measurement errors caused by re-reflection will become more serious.

OBJECTS OF THE INVENTION

A general object of the present invention is to provide a dielectric lens suitable for electromagnetic test purposes.

Another object of the present invention is to provide a dielectric lens for antenna test ranges that eliminates the $2D^2/\lambda$ constraint.

A further object of the present invention is to provide a dielectric lens for producing plane waves a relatively short distance from the radiating source.

A still further object of the present invention is to provide an antenna test range or anechoic chamber that accurately simulates far field conditions.

Yet another object of the present invention is to provide planar phase fronts in modestly sized antenna test ranges, or anechoic chambers.

A still further object of the present invention is to provide electrically large test regions in antenna test ranges through use of a dielectric lens.

Yet another object of the present invention is to provide a method of far field testing microwave antennas and the like in chambers or on ranges less than about twenty (20) feet in length.

Still another object of the present invention is to provide a dielectric lens including absorber means to substantially eliminate reflection problems attendant upon modest sized test ranges.

A further object of the present invention is to provide a dielectric lens including absorber means that effectively increases the size of the test aperture.

Various other objects and advantages of the invention will become clear from the following description of embodiments thereof, and the novel features will be particularly pointed out in connection with the appended claims.

THE DRAWINGS

Reference has been and will hereinafter be made to the accompanying drawings, wherein.

DESCRIPTION OF EMBODIMENTS

The invention is based, in one aspect, on the realization that the dielectric constant in foamed plastics is an inverse function of foam density, and the latter parameter can be controlled during manufacture. The desired dielectric constant in the lens of the invention is one that is large enough to shape the phase curvature, but not so high as to cause a larger surface reflection from the lens and block the wave, which happens at about $E_r = 1.7$. The dielectric constants of the solid dielectrics noted hereinabove are all 2.1 or greater. By using foamed plastics, the dielectric constant can be held in the range of about 1.05 to 1.3, which has been determined experimentally to be preferred for purposes of the invention. For polyurethane foams, the 1.3 upper limit corresponds to a density of about 14 pounds per cubic foot. In another aspect, the invention is based on the realization that amplitude distortions and reflections can be eliminated by use of a small source antenna as the source antenna, and by always using appropriate radiation absorbing material to define a radiation path between the source and the lens and, in most cases, between the lens and test aperture as well.

The dielectric lens by itself, however, was found to create re-reflection problems of sufficient magnitude as to severely restrict utility. Accordingly, a still further aspect of the invention is provision of a novel absorber structure to suppress these extraneous signals. With absorbers, the dielectric constant range of the lens can be from 1.05 up to 1.5 (See FIG. 11). Generally if $E_r$ is very low, the lens must be very large, and if $E_r$ is very high, both external and internal reflections cause problems.

Figure 6:
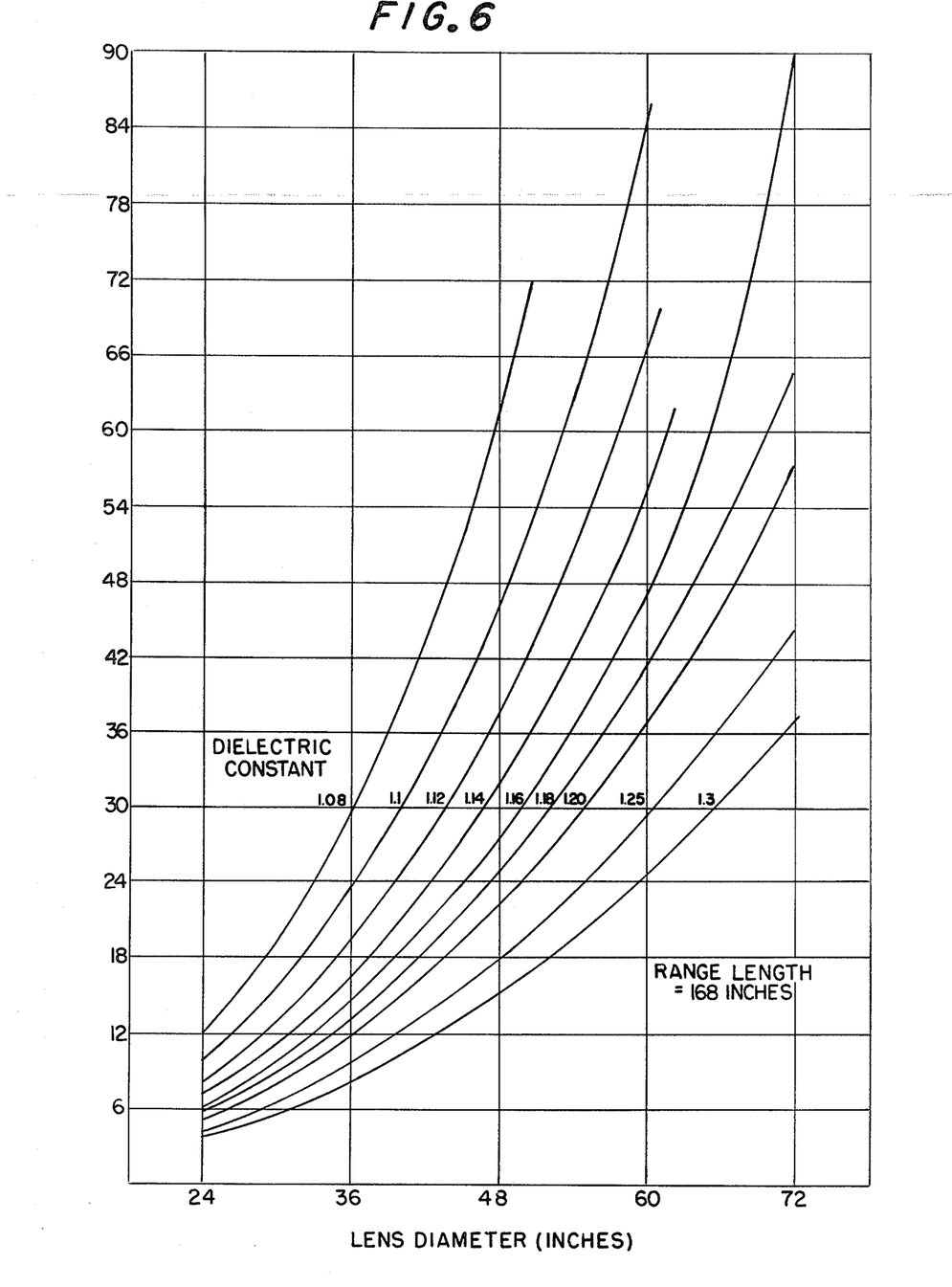
FIG. 6 is a lens design curve, diameter vs. thickness, for foam plastic dielectrics in accordance with the present invention.

As illustrated in FIG. 1, an anechoic chamber 10 has a point source antenna 12 and a test antenna 14. Dielectric lens 16 is placed a distance equal to 4 times its diameter from antenna 12 (e.g. its focal length); and includes absorber 30 described hereinbelow in connection with FIG. 4. Spherical wave fronts 18 radiating from antenna 12 are converted to plane wave fronts 20 after passing through lens 16. Typically chamber 10 may be 20 feet long and have a range length of 15 feet. For a foamed plastic of dielectric constant $E_r = 1.25$, it can be deduced from FIG. 6 that a 36 inch diameter lens should be 10 inches thick. Thus, test antenna 14 will see a virtually flat wave front, as quantified hereinbelow. FIG. 6 includes curves for dielectrics having $E_r$ throughout the preferred range, and were calculated from equation 12. The conditions assumed were those typical for chambers in many laboratories, e.g. $R = 168$ inches.

While anechoic chambers perhaps represent the broadest use of the invention, others are apparent. Assume a test fixture is needed to test out an antenna system, located in the nose of an airplane. Assume it is a two foot dish at X-Band. Obviously it would be advantageous to leave the antenna installed on the plane during the test. Heretofore, when applying the $2D^2/\lambda$ curvature, the use of a 100 foot antenna range would be required, and the best site would have to be elevated to 15 feet or more above ground level. Obviously it is not practical to place the aircraft in the air just to check antennas, so the next best thing is done: remove the antennas, put them on the range, make the necessary adjustments and reinstall the antenna.

Figure 5:
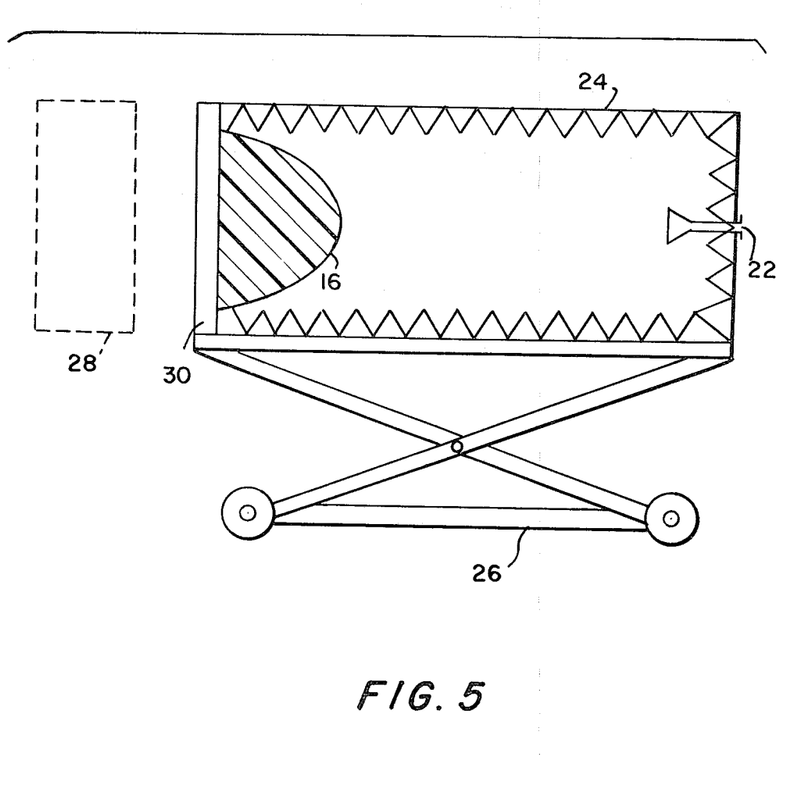
FIG. 5 is a simplified schematic drawing of a test fixture employing the invention.

As shown in FIG. 5, using the lens 16 of the present invention, a test fixture including a radiation source 22, lens 16 and an absorbent cone 24 is mounted on a dolly 26 which could be rolled up to the nose of the aircraft. Since the aircraft's antenna system was being illuminated by a plane wave front of the proper type, it would perform normally and the equipment could be checked out as installed, functioning as it would in the air. More particularly, a parabolic dish (test) antenna 28 will produce a substantially plane wave front seen by antenna 22. By use of suitable time delay means (not shown) the incident signal is re-broadcast by antenna 22, through lens 16 and antenna 28 will 'see' a simulated reflected plane wave signal of a known delay. By varying the delay, accuracy of the test set in ranging from a few hundred yards to transmission limits can be tested.

Manufacture of lenses in accordance with the invention is not critical, but blowing of the foams should be strictly in accordance with the manufacturer's directions, so as to avoid unfoamed pockets that would cause phase distortion.

For the manufacture of a large number of identical lenses, it is worthwhile to invest in a mold of the desired shape, and by carefully regulating amounts of prepolymer and blowing agent, molding in situ lenses of the desired density and dielectric constant.

More commonly, a lens is desired for a specific environment, and machining a preformed block is preferred to molding for economic reasons. Such blocks are available commercially and, with them, the problems and hazards of blowing (e.g. unfilled areas and toluene diisocyanate fumes) can be avoided. Since the machining should be as accurate as possible to obtain the desired figure of revolution, a tape or direct numerical control tracer mill with 3-axis control is preferred.

Most rigid and flexible foams are suitable for use with the invention, though it will be appreciated that rigid foams are preferred for ease of handling and to remove any problem with distortion. Set forth below in Table I are some of the foams which are suitable, with the dielectric constant or range thereof available, as measured by ASTM D1763 (Source: 1975-76 Modern Plastics Encyclopedia).

TABLE I

| Foamed Plastics | Dielectric Constant, $E_r$ |
| --- | --- |
| Cellulose Acetate | 1.12 |
| Epoxy, rigid closed cell | 1.08-1.19 |
| Phenolics | 1.19-1.20 |
| Polyethylene, low and intermediate density | 1.05-1.15 |
| Polyethylene, cross-linked | 1.1-1.55 |
| Polyurethane, rigid | 1.05-1.5 |
| Polyurethane, flexible | 1.0-1.5 |
| Silicone, open cell | 1.2 |

Rigid, closed-pore foams are preferred, so that humidity changes will not affect the lens; hydrophilic foams should be avoided. However, in principle any foamed material could be used to achieve the desired test conditions. These foams are not temperature sensitive from an operational viewpoint.

Thus, for a planoconvex lens the necessary data is used in equation 12 and the lens design is established. While the technique is the same as for conventional lenses, the lenses themselves have a novel configuration due to the material employed. Meniscus lenses, while satisfactory from an operational viewpoint, involve more complex mold or machining requirements. They are preferred for high productive volume or very large lenses, due to savings of material.

Lenses in accordance with the invention are useful as indicated hereinabove, and also in tapered anechoic chambers, where they will permit use of the full region at higher frequencies, large (e.g. 30'×60') rectangular or tapered chambers, where they permit use of the full 6-8 ft. test region, and in general purpose test fixtures, one of which has been described.

Figure 4:
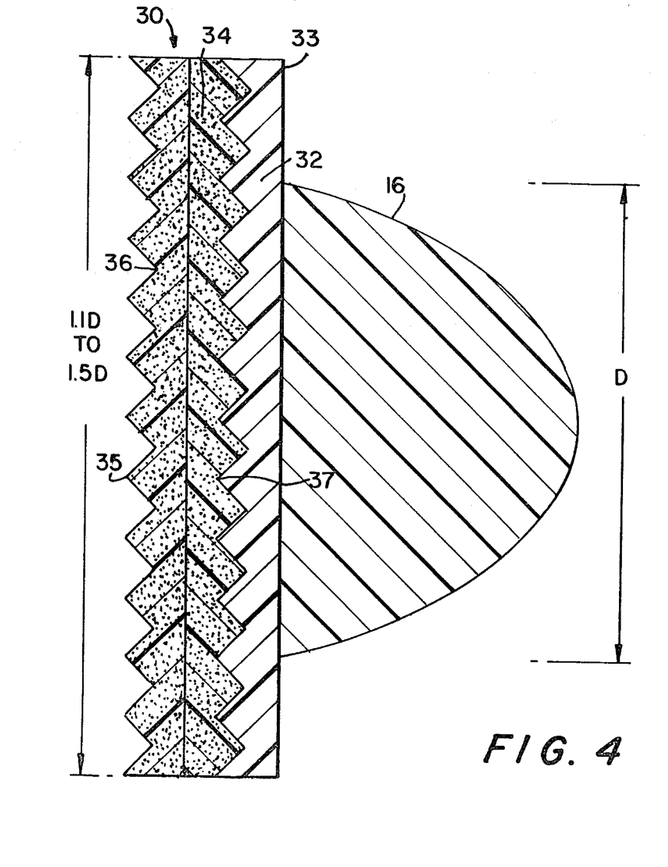
FIG. 4 is a cross-sectional elevation of a lens illustrating the absorber structure.

The structure of the lens 16 with its associated absorber 30 is illustrated in FIG. 4, and attention is directed thereto. The absorber 30 comprises three layers, each being a pyramidally-cut piece of flexible foam material having a flat back surface. Layer 32 is used only as a mount for the others, having its flat surface 33 affixed to the flat surface of lens 16. Layer 32 is electrically inert, e.g. it does not have a conductive carbon loading. Layer 34 is loaded with carbon, and is cut so that its pyramidal "peaks" nest in the pyramidal "valleys" of layer 32. Layer 36 is also loaded with carbon, and is back-to-back with layer 34, but is offset with respect thereto so that "peaks" 35 of layer 36 correspond with "valleys" 37 of layer 34. This insures that insertion loss is constant through absorber 30, and the uniform plane wave is not disturbed by phase distortions.

Figure 11:
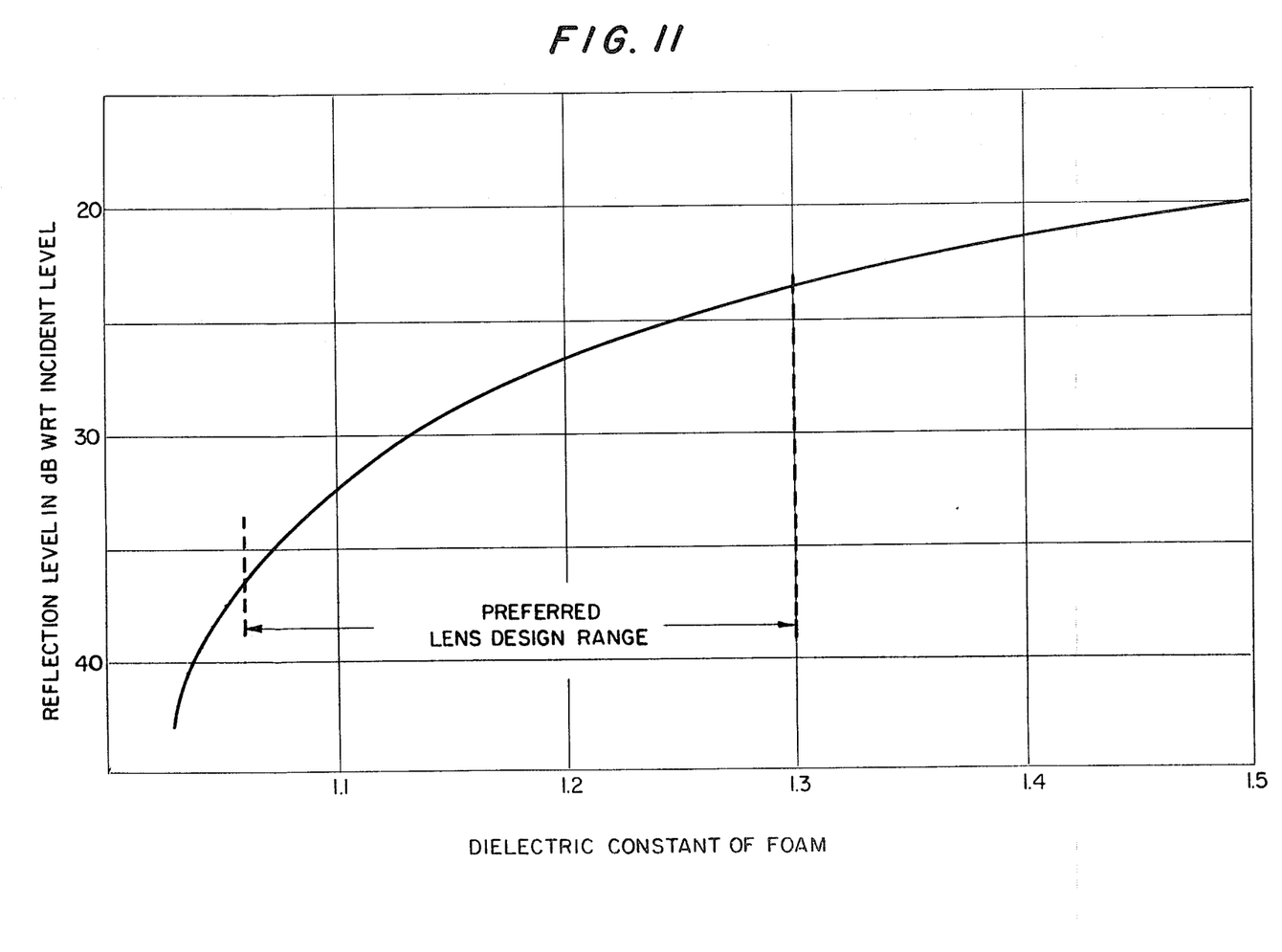
FIG. 11 is a plot of lens reflection properties, $E_r$ vs. reflection level in dB.

The amount of energy reflected from the surface of the lens is a function of its dielectric properties. FIG. 11 shows this relationship over the range of dielectric constants that are of practical interest. Note that for most designs, the extraneous energy contribution will be on the order of 25-35 dB.

For most antenna range designs, the designer tries to have the extraneous energy levels suppressed to the −45 to −55 dB level. This permits accurate testing of most radiating devices. Only in extreme cases do the requirements exceed −55 dB. From a practical point of view, levels more than −40 dB mean the measurement accuracies exceed ±1 dB, which is the most uncertainty that can normally be tolerated.

The test system designer must layout his test systems to meet these requirements. That is, for a lens system, an additional suppression on the order of 5 to 30 dB must be added depending on the type of lens used and the type of testing to be performed. This is accomplished by the use of a properly selected absorber 30.

Until recently only solid plastic absorbers existed, and these were limited to the −20 to −30 dB range because of the difficulty of getting energy to propagate into solid surfaces. That is, the surface reflections due to the solid plastics limited the amount of energy that could be attenuated. With the advent of plastic foam, dielectric constants on the order of 1.02-1.1 were made available, and the foam high performance absorber (loss>30 dB) was made possible. Today it is common to produce absorbing materials with reflection losses on the order of 60 dB. This is accomplished by impregnating the foam with a conductive carbon dispersion which is critically loaded to get the high reflectivity losses. However, even with low dielectric constant properties, shaping of the material is required. Thus, for low reflection properties it is necessary to load the foam with the right conductivity solution. Also, the geometry of the foam must be tapered to act as a load with a gradual transition from the absorber medium to that of free space. Thus, the pyramidal geometry was chosen early in the development of the absorbing materials.

Figure 12:
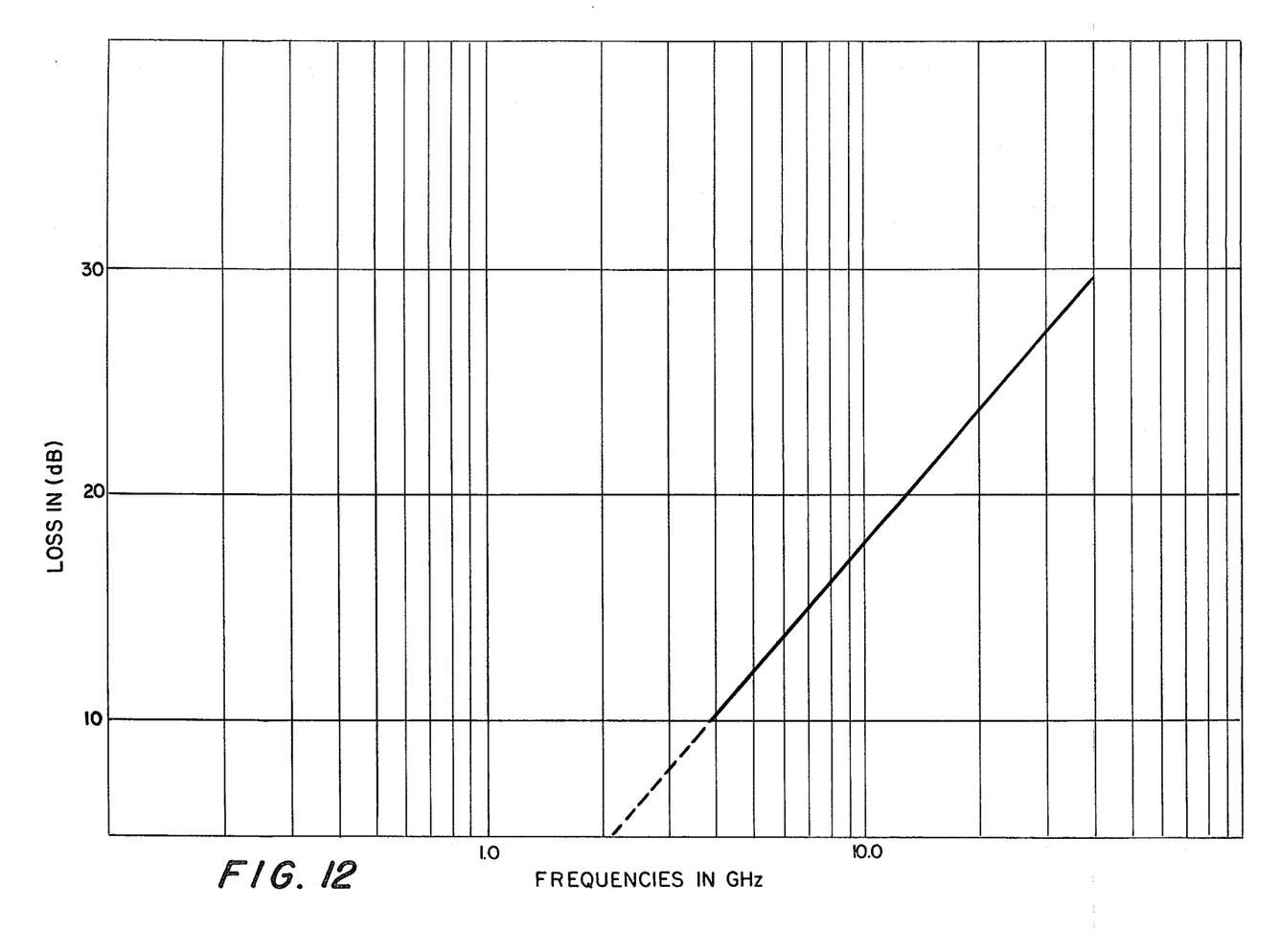
FIG. 12 is a performance curve for a 2 in. pyramidal absorber, frequency vs. loss, in dB.

Current available absorbers provide a large loss for a given thickness. The thinnest available is a two inch pyramidal absorber, and has about 18 dB of insertion loss at X Band, FIG. 12. The slope of the loss curve is 6 dB per octave. For low reflection properties under two way propagation conditions, the tapered material must point in both directions for minimum surface reflections. Therefore, the total insertion loss is 36 dB which is out of the range discussed supra, where an absolute maximum of 30 dB is estimated to be required. This accounts for the use of two loaded foam layers 35, 36, one pointing toward the energy source and the other toward the device under test. Thus, absorbers tailored for incorporation in the plane wave lenses must be specifically designed for that purpose.

From the test requirements and knowing the dielectric constant of the lens and the path length between the target and the source, the level of the extraneous signals are estimated. This is compared to the test requirements and the amount of additional loss calculated. This insertion loss is then used as a guide in loading the pyramidal foam material which is to be mounted on the flat face of the lens, as described below.

Absorber 30 extends beyond the diameter of the lens by 1.1 to 1.5 diameters to minimize the discontinuity introduced by the addition of the absorber to the back of the lens. Such discontinuities are apparent in FIGS. 7 and 8, discussed hereinbelow. In essence, the large diameter of absorber 30 enlarges the test aperture and reduces edge diffraction. A further but optional feature of absorber 30 is to cut the circumference thereof in a relatively large saw-tooth (or sunburst) pattern (not shown), which randomly breaks up waves at the edges and reduces their effect.

Those skilled in the art will appreciate that the additional loss introduced by absorber 30 must be accounted for when computing the overall RF power budget for a test system.

Upon completion of the lens manufacture, it is placed in an anechoic chamber and the electromagnetic field variations develop by it are measured with a field probe, a low gain antenna carried on a track-mounted platform. The antenna is slowly passed through the test aperture and the resultant amplitude and phase variations measured.

Understanding of the invention will be facilitated by referring to a specific example of how the absorber is designed.

A typical test requirement for the lens structure of the invention is to measure a 4 foot antenna's first side lobe to within ±0.5 dB, where the side lobe lever is −20 dB. Such tests are commonly preformed on radar, microwave link and satellite communication antennas. The lens diameter is 6 feet, $E_r$=1.16, and the range length is 30 feet. The reflected ray will be reduced by $$20 \log \frac{30^2}{34^2} = -2.2 dB \qquad [14]$$

Figure 13:
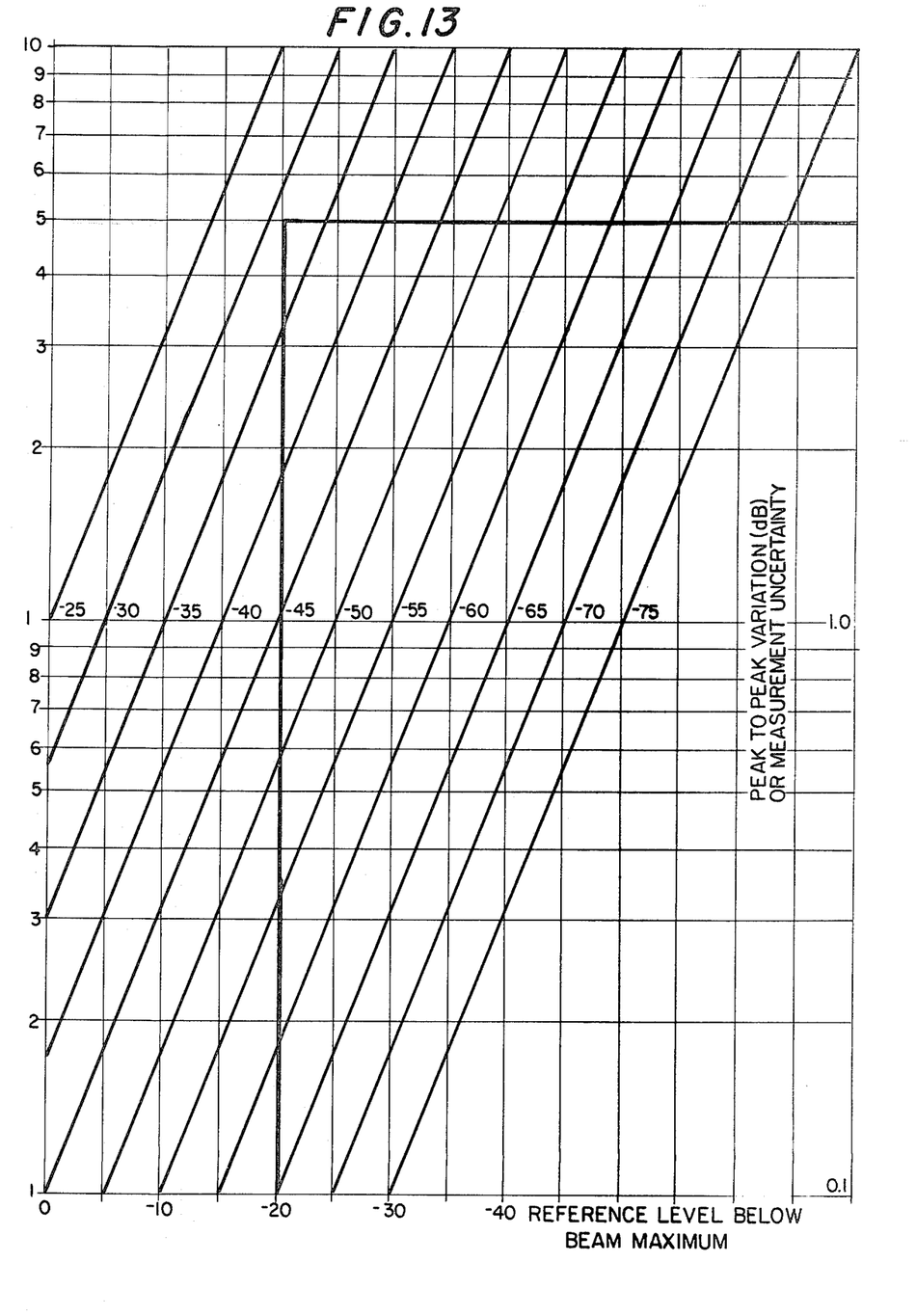
FIG. 13 is a nomograph for calculating measurement uncertainty for various extraneous signal levels.

From FIG. 11, it appears that the level of extraneous energy reflected by this lens is −28.6 dB. Adding the two losses (−30.8 dB) and referring to FIG. 13, one draws a line from the direct beam level ($E_d$=−20 dB) to where it crosses the extraneous level ($E_x$=−30.8 dB) to find that this results in a measurement uncertainty of 5 dB peak-to-peak (±2.5 dB). To achieve the desired certainty level (±0.5 dB) about −45 dB of suppression is required, and the reflected wave must be attenuated by about 14 dB. Each layer of absorber 30 must thus provide 7 dB of insertion loss at the test frequency.

Procedures for loading conductive carbon into flexible foam materials are well known to those skilled in the art of producing radiation absorbers, and needn't be discussed in great detail. Only flexible foams can be impregnated, so they are required. Dispersion of carbon in suitable carriers are available from Atcheson Colloid Co. and others. This is mixed in specific proportions with a latex binder and, optionally, other materials such as flame retardants. Absorber layers 34,36 are soaked in this mixture until a desired wet weight is achieved, indicating the proper degree of loading. The layer is then dried. Those skilled in the art will appreciate that loading levels required for absorber 30, generally in the range sufficient to cause 2.5 to 15 dB suppression per layer, are low compared to conventional absorbers.

Absorber 30 may be assembled, and attached to lens 16, with conventional cements. Greater flexibility may be achieved, however, if lens 16, and inert layer 32 are assembled as one unit, and layers 34,36 are assembled as a second unit. This allows absorbers having varying degrees of suppression to be used, e.g. a lens 16 and inert layer 32 may be provided with a set of interchangeable absorbers, each absorber adapted for particular conditions. In such a case suitable means must be provided to mechanically (and removably) lock the two units together.

The use of an absorber 30 with a miniscus lens requires only that inert layer 32 have its flat surface 33 shapes so as to conform to the concave lens surface.

Understanding of the invention will be further facilitated by reference to the following specific example, and accompanying FIGS. 6-9.

EXAMPLE

Uniform amplitude characteristics of the source radiation were achieved by proper source antenna size selection, consistent with the 0.5 dB criteria discussed hereinabove.

A 32 inch diameter lens was made from expanded polyurethane foam which had a measured dielectric constant of 1.16. Using the 1.16 dielectric constant and a 32 inch diameter the lens required was 12 inches thick (cf. FIG. 6). This seemed to be practical and therefore the foam was purchased and shaped in a parabolic shaped lens per the design equation 12. The lens was then placed in the chamber and the resultant fields probed to determine their uniformity. To determine effects of the lens per se, no absorber was used in these tests.

Figure 7:
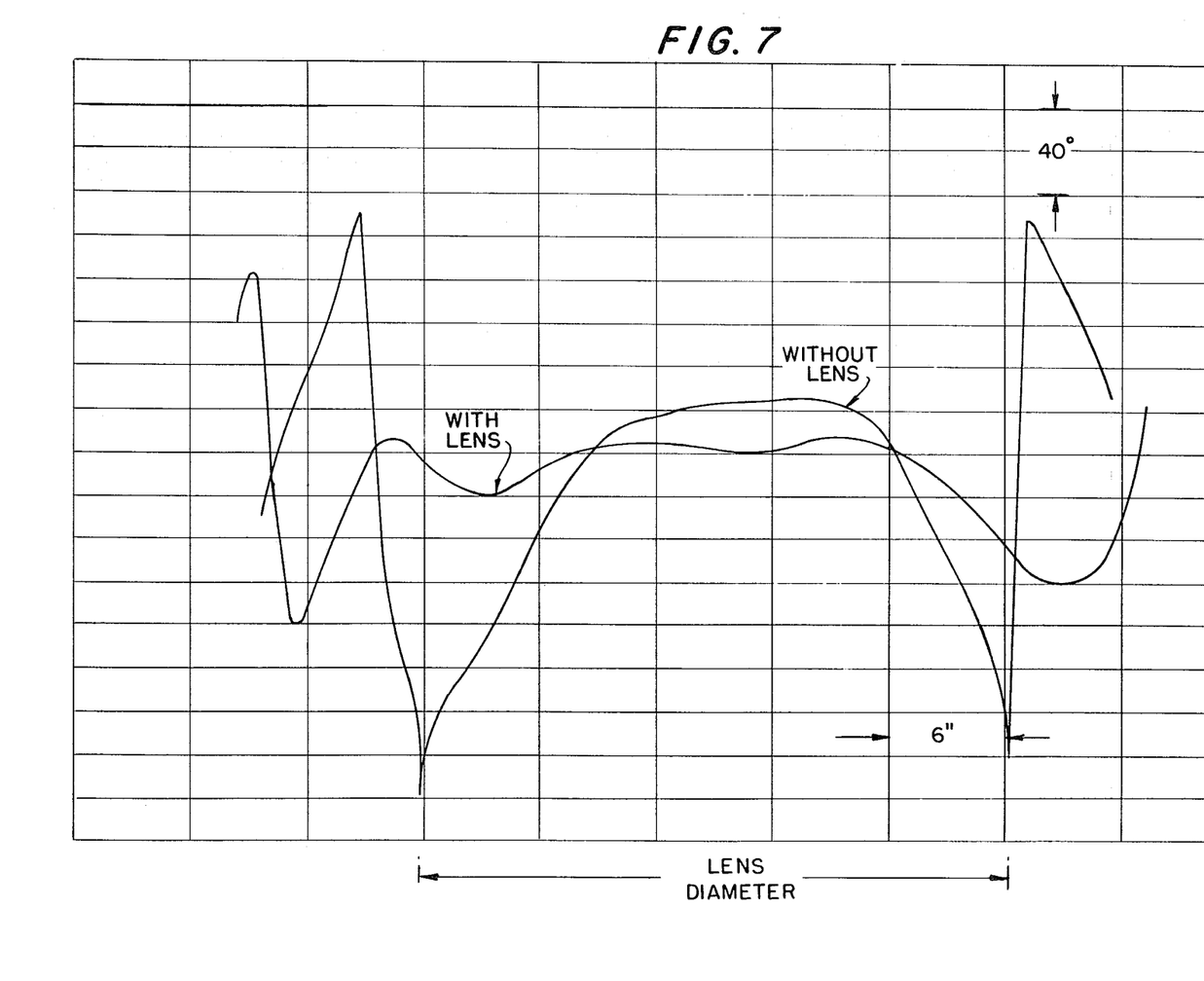
FIGS. 7 and 8 are charts showing phase and amplitude probe data, respectively, with and without a lens.

FIG. 7 is a plot of the phase characteristics of the field with and without the lens. (This FIGURE is based on 'smoothed' data, because measurements are extremely difficult to make. The equipment available was not able to hold a high tolerance so the measured data must be interpreted with the difficulties involved.) However, the results were most encouraging. Indeed, when the lens was inserted in the field, the phase variation was considerably less, and quite flat, over a good portion of the plot.

Figure 8:
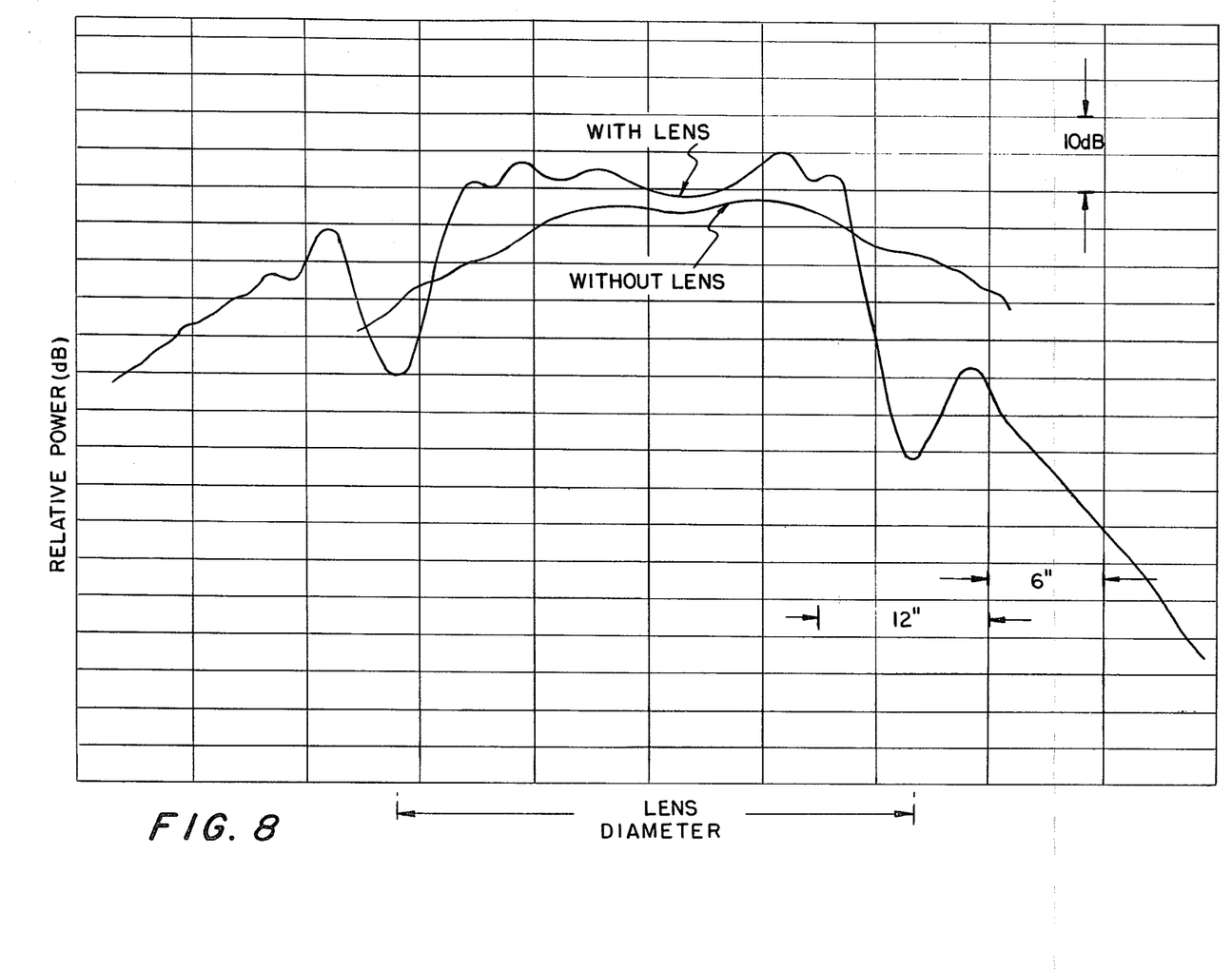

FIG. 8 shows the amplitude characteristics obtained with and without the lens inserted in the field. Note that with the lens the amplitude characteristics show a substantial portion that is essentially flat. This is the area immediately behind the lens probe in parallel with the lens face. This shows that the field variation is less than 0.5 dB peak to peak which is quite acceptable for most test purposes. The steep skirts on either side are due to diffraction effects around the edges of the lens. This is typical of an obstruction placed in an electromagnetic field. This edge effect is reduced by making the lens larger than the test region, and by use of the absorber, as noted supra.

Figure 9:
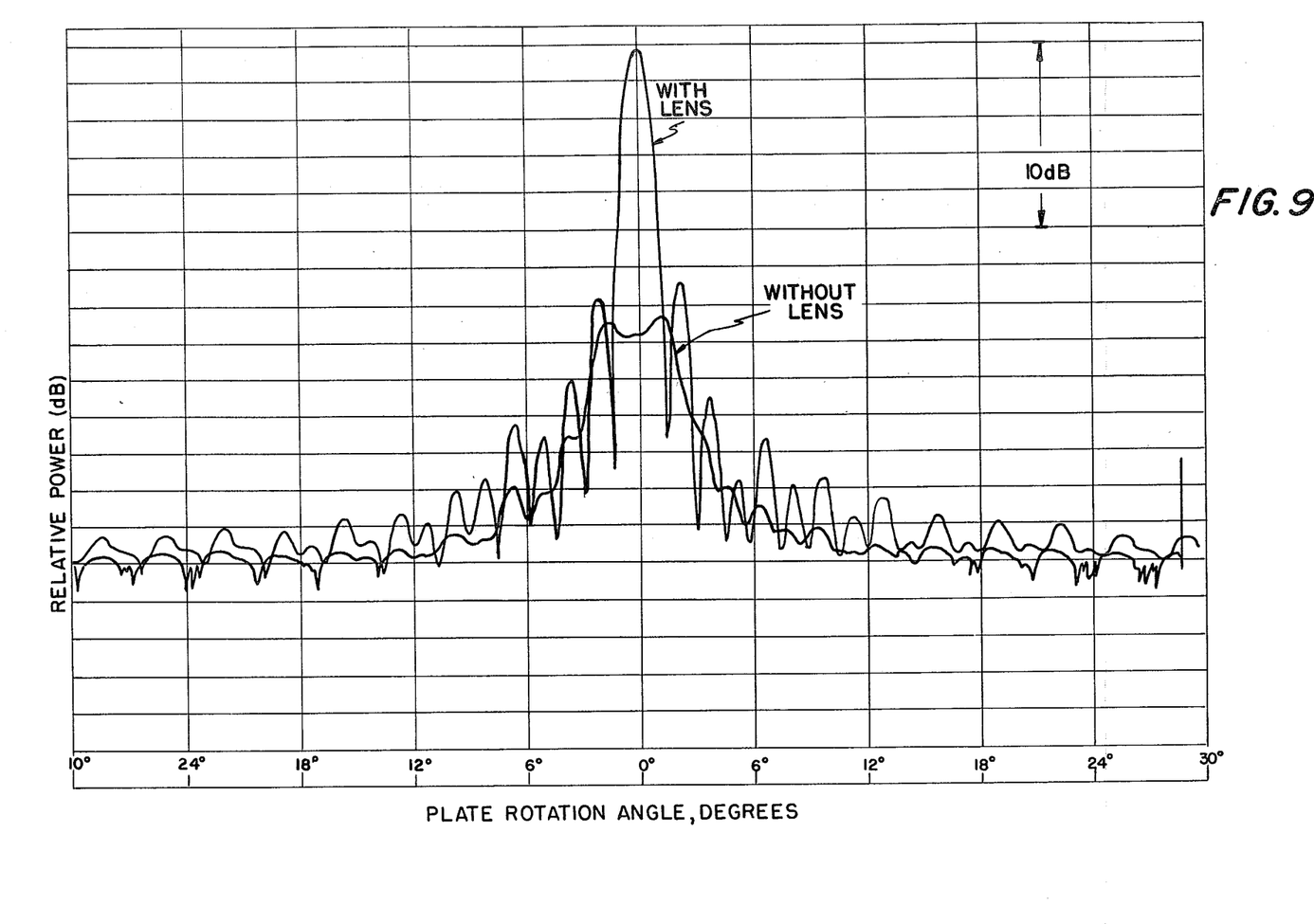
FIGS. 9 and 10 are charts showing other tests results with the invention.

Subsequently a 2 foot by 2 foot plate was placed in the chamber and measured as a reflector with and without the lens in place. Such plates are used as reference standards to measure the performance of absorption materials. Results are shown in FIG. 9. Note that the beam without the lens starts to break up on the peak (this is typical of what happens to antennas tested in the near field; i.e., the phase deviation is so great that the pattern breaks up). However, the pattern with the lens in place is very clear—this is a picture of an antenna that has been measured in the far field ($R \leq 2D^2/\lambda$). Thus, the lens achieves exactly the results desired.

The system was then used to test some sheet absorbing material. The results of the test are shown in FIG. 9. Curve 2, with an absorber covering the plate, gives a direct reading in dB of the absorber compared to the reference plate. In this case, a reduction of 20 dB means a 1/100 power ratio for reflected radiation. Thus, the goal of performing absorber tests inside a small anechoic chamber, rather than outside on a 100 foot antenna range, was met.

Various changes in the details, steps, materials and arrangements of parts, which have been herein described and illustrated to explain the nature of the invention, may be made by those skilled in the art within the principle and scope of the invention as defined in the appended claims.

What is claimed is:

1. A dielectric lens for converting a spherical wavefront of electromagnetic radiation to a plane wave comprising:

a planoconvex lens formed of uniformly foamed plastic having a dielectric constant in the range of 1.05 to 1.5;

a radiation-absorbing covering on the planar surface only of said lens;
said covering being adapted to substantially prevent reflection of radiation.

2. The dielectric lens as claimed in claim 1, wherein said covering comprises a pair of pyramidally-cut foamed plastic sheets loaded with conductive carbon and mounted back-to-back, with peaks in one sheet adjacent valleys in the other.

3. The dielectric lens as claimed in claim 2, wherein said covering is 1.1 to 1.5 times larger than said planar surface.

4. The dielectric lens as claimed in claim 2, and additionally comprising a third pyramidally-cut foamed plastic sheet having its flat surface affixed to said planar lens surface, and its pyramidally cut surface affixed to one of said pair of sheets in mating relation.

5. The dielectric lens as claimed in claim 4, wherein said third sheet is detachably secured to said pair of sheets.

6. The dielectric lens as claimed in claim 1, wherein said radiation-absorbing covering is adapted to provide between 5 and 30 dB of suppression.

7. A dielectric lens for converting a spherical wavefront of electromagnetic radiation to a plane wave comprising:
a miniscus lens formed of uniformly foamed plastic having a dielectric constant in the range of 1.05 to 1.5;
a radiation-absorbing layer adjacent the concave surface only of said lens;
said covering being adapted to substantially prevent reflection of radiation.

8. The dielectric lens as claimed in claim 7, wherein said layer comprises a pair of pyramidally-cut foamed plastic sheets loaded with conductive carbon and mounted back-to-back, with peaks in one sheet adjacent valleys in the other.

9. The dielectric lens as claimed in claim 8, wherein said layer is 1.1 to 1.5 times larger than said lens diameter.

10. The dielectric lens as claimed in claim 8, and additionally comprising a third pyramidally-cut foamed plastic sheet having a convex surface affixed to and mating with said planar lens concave surface, and its pyramidally cut surface affixed to one of said pair of sheets in mating relation.

11. The dielectric lens as claimed in claim 10, wherein said third sheet is detachably secured to said pair of sheets.

12. The dielectric lens as claimed in claim 7, wherein said radiation-absorbing covering is adapted to provide between 5 and 30 dB of suppression.

13. A test fixture for an electromagnetic test range comprising:
a movable supporting structure;
an electromagnetic radiation antenna mounted on said structure;
a dielectric plane wave lens mounted on said structure in a fixed, spaced relation to said antenna, said lens being formed of a uniformly foamed plastic having a dielectric constant in the range of 1.05 to 1.5;
a radiation-absorbing layer adjacent only the side of said lens adapted to face a test object; and
radiation-absorbing material surrounding the radiation path between said antenna and said lens.

14. The test fixture as claimed in claim 13, wherein said antenna is a transmitting antenna, and said lens is oriented to transmit a planar wavefront into free space.

15. The test fixture as claimed in claim 14, wherein the distance between said antenna and said lens equals the focal length of said lens.

16. The test fixture as claimed in claim 14, wherein said antenna is a receiving antenna, and said lens is oriented to transmit a planar wavefront to said antenna.

17. The test fixture as claimed in claim 13, wherein radiation-absorbing material on said lens side provides between 5 and 30 dB of suppression.

18. An electromagnetic test range comprising:
a source of electromagnetic radiation;
a test device;
a dielectric plane wave lens between said source and said device, said lens being formed of a uniformly foamed plastic having a dielectric constant in the range of 1.05 to 1.5 and positioned to direct a plane wave to said device;
first radiation-absorbing means surrounding the path between said source and said device for minimizing reflections and amplitude distortion; and
second radiation-absorbing means adjacent said lens on the side of said test device only, said second absorbing means adapted to substantially eliminate wave re-reflections.

19. The electromagnetic test range as claimed in claim 18, wherein the distance between said source and said lens equals the focal length of said lens.

20. The electromagnetic test range as claimed in claim 18, wherein said surrounding means comprise an enclosure for said source, test device and lens, said enclosure having interior surfaces adapted to absorb electromagnetic radiation and forming an anechoic chamber.

21. The electromagnetic test range as claimed in claim 18, wherein said test device is a receiving antenna.

22. The electromagnetic test range as claimed in claim 21, wherein the diameter of said lens is larger than the size of said antenna.

23. The electromagnetic test range as claimed in claim 18, wherein said second absorbing means is 1.1 to 1.5 times larger than said lens, and is adapted to provide between 5 and 30 dB of suppression.

24. The method of testing electromagnetic devices under far-field conditions on an antenna range comprising:
generating a test signal having a spherical wavefront at a first point,
employing interception means to intercept said signal at a second point and convert same to a planar wavefront;
intercepting the converted wavefront with the antenna to be tested;
providing first radiation-absorbing means adjacent the path of said signal adapted to minimize amplitude distortion and reflection;
said interception means comprising a plane wave lens constructed of a uniformly-foamed plastic having a dielectric constant in the range of 1.05 to 1.5;
providing second radiation-absorbing means only on the side of said lens facing said tested antenna to absorb signals reflected from said antenna; and
measuring predetermined properties of said device.

25. The method as claimed in claim 24, wherein the distance between said first and second points equals the focal length of said lens.

26. The method as claimed in claim 24, wherein said second radiation-absorbing means is near the planar side of said lens and is adapted to provide between 5 and 30 dB of suppression.

* * * * *

UNITED STATES PATENT AND TRADEMARK OFFICE
CERTIFICATE OF CORRECTION

PATENT NO. : 4,218,683

DATED : Aug. 19, 1980

INVENTOR(S) : Leland H. Hemming

It is certified that error appears in the above-identified patent and that said Letters Patent are hereby corrected as shown below:

Col. 2, line 7: In equation (1), "$\leq$" should be -- $\geq$ --.

Col. 3, line 31: In the expresion "$p\rho$" delete "$\rho$".

Col. 4, line 31: "$dD^2$" should be --$2D^2$ --; line 36: "lease" should be -- least --.

Col. 5, line 2: "6,611,691" should be -- 3,611,691 --; Col. 5, line 5: after "with" delete "a"; line 6: "depression" should read - supression Col. 9, line 67: "systems" should read --system --.

Col. 11, line 57:  -shapes - should be --shaped --.

Figure 10:
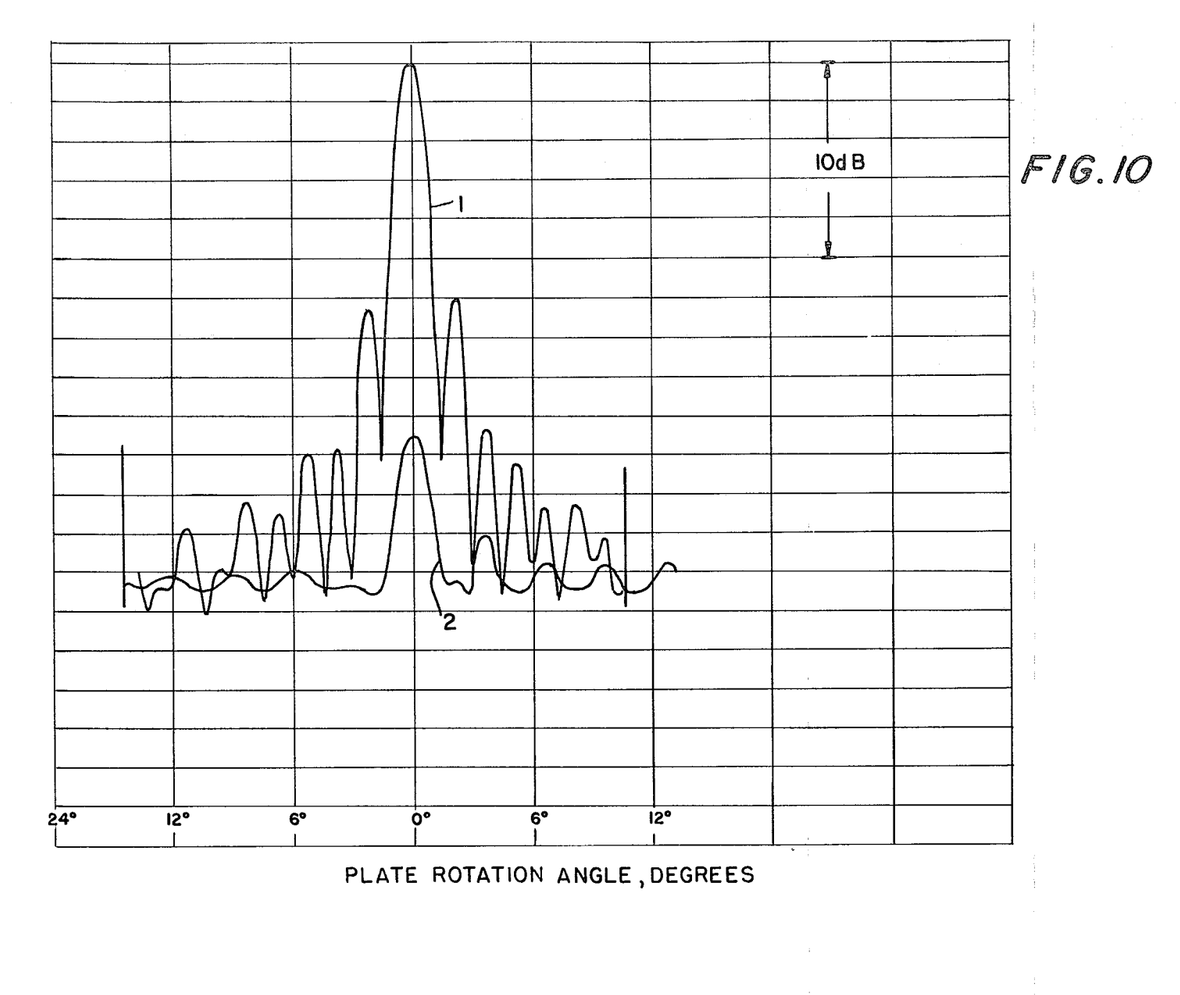

Col. 12, line 44: "$\leq$" should be -- $\geq$ --; line 47: "FIG. 9" should be FIG. 10 --.

In the caption, item [56], "References Cited", line 13, after "IEEE" "5/65" should be --8/65-; line 15, after "IRE" "9/52" should be --2/53--

Signed and Sealed this

Sixth Day of January 1981

[SEAL]

Attest:

SIDNEY A. DIAMOND

Attesting Officer

Commissioner of Patents and Trademarks